United States Patent
Wu et al.

(10) Patent No.: US 11,932,553 B2
(45) Date of Patent: Mar. 19, 2024

(54) ULTRA-HIGH PURITY TUNGSTEN CHLORIDES

(71) Applicant: Versum Materials US, LLC, Tempe, AZ (US)

(72) Inventors: Xiaoxi Wu, Encinitas, CA (US); Sergei V. Ivanov, Schnecksville, PA (US); Neil Osterwalder, Carlsbad, CA (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 16/710,834

(22) Filed: Dec. 11, 2019

(65) Prior Publication Data

US 2020/0189928 A1    Jun. 18, 2020

Related U.S. Application Data

(60) Provisional application No. 62/780,417, filed on Dec. 17, 2018.

(51) Int. Cl.
| | |
|---|---|
| *C01G 41/04* | (2006.01) |
| *B01D 7/00* | (2006.01) |
| *C23C 16/14* | (2006.01) |

(52) U.S. Cl.
CPC .............. *C01G 41/04* (2013.01); *B01D 7/00* (2013.01); *C23C 16/14* (2013.01); *C01P 2006/80* (2013.01)

(58) Field of Classification Search
CPC .......... C01G 41/04; B01D 7/00; C23C 16/14; C01P 2006/80

(Continued)

(56) References Cited

U.S. PATENT DOCUMENTS

| | | | |
|---|---|---|---|
| 2,743,169 A | 4/1956 | Hecker | |
| 3,066,010 A | 11/1962 | Stauffer | |

(Continued)

FOREIGN PATENT DOCUMENTS

| | | |
|---|---|---|
| CN | 108298586 A | 7/2018 |
| KR | 10-2018-0067637 A | 6/2018 |

(Continued)

OTHER PUBLICATIONS

Istratov, et al., "Iron contamination in silicon technology," Appl. Phys. A, 70, 489 (2000).

(Continued)

*Primary Examiner* — Anita Nassiri-Motlagh
(74) *Attorney, Agent, or Firm* — Daniel A. Demarah, Jr.

(57) ABSTRACT

Condensable metal halide materials, such as but not limited to tungsten hexachloride and tungsten pentachloride can be used deposit films metal or metal containing films in a chemical vapor deposition (CVD) or atomic layer deposition process. Described herein are high purity tungsten hexachloride and tungsten pentachloride systems and methods to purify tungsten hexachloride and tungsten pentachloride raw materials. There is provided a purified tungsten hexachloride and tungsten pentachloride containing less than 10 ppm, preferably less than 5 ppm, more preferably less than 1 ppm, and most preferably less than 0.5 ppm of iron and/or molybdenum; and less than 10 ppm, preferably less than 5 ppm of all other trace metals combined including but not limited to aluminum, potassium and sodium.

15 Claims, 4 Drawing Sheets

(58) Field of Classification Search
USPC .......................................................... 423/492
See application file for complete search history.

(56) References Cited

U.S. PATENT DOCUMENTS

| | | | | |
|---|---|---|---|---|
| 4,182,747 | A | * | 1/1980 | Gravey .................... C01G 1/06 |
| | | | | 423/116 |
| 4,478,600 | A | | 10/1984 | Schoener et al. |
| 4,913,778 | A | * | 4/1990 | Lee ........................ C01G 25/04 |
| | | | | 203/29 |
| 10,100,406 | B2 | | 10/2018 | Wu et al. |
| 2016/0305020 | A1 | | 10/2016 | Versum |
| 2019/0233301 | A1 | * | 8/2019 | Takahashi .............. C01G 41/04 |

FOREIGN PATENT DOCUMENTS

| | | |
|---|---|---|
| SU | 134257 | 3/1960 |
| WO | 2017130745 A1 | 8/2017 |
| WO | 2018105220 A1 | 6/2018 |

OTHER PUBLICATIONS

Parker and Wilson, "Separation of Metal Chlorides by Distillation," I&EC Process Design and Development, 1965, 4(4), pp. 365-368.
Wang, et al., Metallurgical Industry Press, Oct. 31, 2008, 1st edition, 210-211 ("Tungsten Materials and Processing Thereof", extract of a Chinese book). Also included, English Translation and Verification of Translation.

* cited by examiner

ULTRA-HIGH PURITY TUNGSTEN CHLORIDES

CROSS REFERENCE TO RELATED APPLICATION(S)

This application claims the benefit of U.S. Provisional Patent Application No. 62/780,417 filed on Dec. 17, 2018, which is incorporated herein by reference as if fully set forth.

BACKGROUND

The invention relates generally to methods of preparing ultra-high purity tungsten chlorides, including tungsten hexachloride ($WCl_6$) and tungsten pentachloride ($WCl_5$), which will be used for electronic industrial applications.

Metal halides, such as $TaCl_5$, $WCl_6$, $WCl_5$, $WF_6$, $MoCl_5$, $HfCl_4$, $ZrCl_4$, and $AlCl_3$ are widely used in the electronics industry as precursors for deposition of metal, metal oxide and metal nitride films. For certain applications, the semiconductor industry requires high purity precursors with trace metals impurities well below 10 parts per million. This is because the increasing speed and complexity of semiconductor integrated circuits requires advanced processes that put extreme constraints on the acceptable level of metal contamination on the surfaces of silicon wafers.

Metallic contamination on wafer surfaces are known to be a serious limiting factor to the yield and reliability of complementary metal-oxide-semiconductor (CMOS) based integrated circuits (IC). Such contamination degrades the performance of the ultrathin $SiO_2$ gate dielectrics that form the heart of the individual transistors. Iron is one of the most problematic contaminants in the IC industry. Iron is a very common element in nature and is difficult to eliminate on a production line. Iron contamination was found to significantly decrease the breakdown voltage of gate oxides.

The commonly reported mechanism for electrical field breakdown failure from iron contamination is the formation of iron precipitates at the $Si-SiO_2$ interface, which frequently penetrate the silicon dioxide. When dissolved in silicon, iron forms deep levels which act to degrade junction device performance by the generation of carriers in any reverse-biased depletion region. In bipolar junction transistors, generation-recombination centers formed by dissolved iron generally increase the base currents, degrading the emitter efficiency and base transport factors (Istratov et al. Appl. Phys. A, 70, 489 (2000)). Thus, precursors with extremely low levels of iron contamination are highly desired. Purification methods to produce precursors with extremely low iron contamination are also desired.

A commonly used precursor for deposition of tungsten metal is tungsten hexafluoride. This precursor is a gas at ambient temperature, having a boiling point of 17.1 degrees Celsius and can be readily purified of iron contaminants, such as iron fluoride. However, several applications require fluorine-free tungsten precursors.

Tungsten halides, such as $WCl_6$, $WCl_5$ and $WCl_4$ can be used to deposit tungsten films. However, these precursors are often contaminated with iron impurities, for example iron trichloride and iron dichloride and iron oxides. Removal of iron trichloride is specifically challenging because it has a vapor pressure similar to tungsten chlorides.

Several methods were previously considered for purification of metal chlorides, for example distillation and sublimation.

Parker and Wilson (Separation of Metal Chlorides by Distillation. I&EC Process Design and Development, 1965. 4(4): PP365-3680) taught a distillation method to separate an array of metal chlorides from tantalite ore. Such a system is typically very complicated in terms of heat management, as the boiling point of the target materials is typically high, whereas the use of chlorine to prevent decomposition at this high temperature presents corrosion hazards. Special equipment is required to transfer the molten salt product into solid particles for harvesting.

Hecker (U.S. Pat. No. 2,743,169 A) taught a sublimation method that can be used for metal chlorides separation and purification. Typically, sublimation is operated at reduced pressure, which can enhance the productivity and reduced operation temperature. The product is usually formed on a cold wall and is harvested at the end of the purification process in an inert environment, as most metal halides are air and moisture sensitive.

For better solid product uniformity, a fluidized bed is often used. Another advantage of using a fluidized bed is to allow for automation of solid handling, which is difficult to implement with vacuum sublimation process. Schoener et al. (U.S. Pat. No. 4,478,600) taught a method of using fluidization as part of aluminum chloride purification process yielding controlled product particle size. Raw aluminum chloride was first generated through chlorination reaction at high temperature, in vapor phase, followed by a condensing stage to remove most solid impurities. The vapor is then supplied into a fluidization vessel to form product particles. Non-condensable content, such as chlorine, carbon dioxide, and fluidizing gas are passed through a cooling fin for temperature control. Part of the gas is recycled by a pump, whereas the rest is vented through a scrubber. In this work, cold fluidization zone is provided for product condensation and particle formation. Wu and Ivanov (U.S. Pat. No. 10,100,406) taught a method of using a fluidized bed as harvesting part of the sublimation process to remove tungsten oxychloride and other impurity to get greater than 99.0 percent by weight of purity with controlled product particle size.

Korshunov (SU 134257) taught a method of using KCl or NaCl to reduce iron contamination from tungsten hexachloride. In this method tungsten hexachloride vapors were passed through a column packed with lumps of NaCl or KCl or a melt of these salts at 250-400 degrees Celsius and at volumetric ratio of 100:1 vapor to packing column. In another method tungsten hexachloride vapor was bubbled through fused NaCl or KCl liquid with superficial velocity of 5.6 mm/sec passing. The method reduced Fe to 20 ppm in the tungsten hexachloride product. Although the method was demonstrated to remove bulk amount of Fe from crude tungsten chlorides, the iron level in tungsten chloride purified by this method is still too high for electronic application. High operating temperatures (greater than 250 degrees Celsius) also require the use of specialized equipment.

Accordingly, there is a need to provide high purity compositions comprising $WCl_6$ or $W_2Cl_{12}$ and systems to purify a crude material comprising $WCl_6$ or $W_2Cl_{12}$ to obtain a high purity composition comprising $WCl_6$ or $W_2Cl_{12}$. There is also a need for delivery systems to deliver the high purity composition comprising $WCl_6$ or $W_2Cl_{12}$, methods to prepare the delivery system, and apparatuses for depositing a tungsten or tungsten-containing film in a semiconductor device.

There is also an unmet need in the art for a practical, economical and scalable method for production of high purity tungsten hexachloride and tungsten pentachloride.

SUMMARY

An objective of this invention is to provide a method for producing high purity tungsten hexachloride and tungsten pentachloride containing concentrations of iron and molybdenum that are each less than 10 ppm, preferably less than 5 ppm, more preferably less than 1 ppm and most preferably less than 0.5 ppm. A further objective is to achieve these purity levels while avoiding the high operating temperatures and specialized equipment required by prior art methods. Another objective of this invention is to provide tungsten chlorides containing less than 10 ppm and preferably less than 5 ppm of all other trace metals combined.

In addition, several specific aspects of the present invention are outlined below.

Aspect 1: A method of purifying a solid phase raw material comprising tungsten chloride and at least one impurity, comprising:
- (a) heating the solid phase raw material in a first vessel to within a first temperature range to produce a heated raw material;
- (b) contacting the heated raw material with a getter, which results in a reaction between the getter and a reactive portion of the at least one impurity to produce at least one complexed impurity and produces a first intermediate product comprising tungsten chloride, an unreactive portion of the at least one impurity, and the at least one complexed impurity, wherein the at least one complexed impurity has a sublimation point that is greater than a sublimation point of the tungsten chloride and the getter is selected from the group consisting of: potassium chloride, sodium chloride, rubidium chloride, cesium chloride, calcium chloride, magnesium chloride, barium chloride, and combinations thereof;
- (c) performing a separation process on the first intermediate product which results in at least a portion of the at least one complexed impurity being separated from the tungsten chloride and the unreactive portion of the at least one impurity to produce a second intermediate product, the separation process selected from the group consisting of: distillation and sublimation;
- (d) cooling the second intermediate product to within a second temperature range, which results in at least a portion of the unreactive portion of the at least one impurity being separated from the tungsten chloride to produce a product, wherein the product is enriched in tungsten chloride relative to the solid phase raw material and the second intermediate product;

wherein steps (a) through (e) are performed within a first pressure range.

Aspect 2: The method of Aspect 1, further comprising:
- (e) cooling the unreactive portion of the at least one impurity to a third temperature range, to produce a condensed light impurity.

Aspect 3: The method of any of Aspects 1-2, further comprising:
- (g) optionally, recovering the product produced in step d and using it as the solid phase raw material in step a.

Aspect 4: The method of any of Aspects 1-3, wherein step a comprises heating the solid phase raw material in a first vessel to a first temperature range, to produce a heated raw material wherein the solid phase raw material comprises from 80 to 90 percent by weight of tungsten hexachloride, and wherein a balance of the solid phase raw material comprises at least one impurity selected from the group consisting of molybdenum chloride, iron chloride, aluminum chloride, chromium chloride, nickel chloride, copper chloride, tungsten oxytetrachloride and tungsten pentachloride.

Aspect 5: The method of any of Aspects 1-4, wherein step a comprises heating the solid phase raw material in a first vessel to a first temperature range, to produce a heated raw material wherein the solid phase raw material comprises from 80 to 90 percent by weight of tungsten pentachloride, and wherein a balance of the solid phase raw material comprises at least one impurity selected from the group consisting of molybdenum chloride, iron chloride, aluminum chloride, chromium chloride, nickel chloride, copper chloride, and tungsten oxytetrachloride.

Aspect 6: The method of any of Aspects 1-5, wherein step a comprises heating the solid phase raw material in a first vessel to a first temperature range, to produce a heated raw material wherein the first vessel comprises a sublimer and the first temperature range comprises a temperature range greater than a sublimation point of the tungsten chloride and less than the sublimation point of the at least one complexed impurity.

Aspect 7: The method of any of Aspects 1-6, wherein step a comprises heating the solid phase raw material in a first vessel to a first temperature range, to produce a heated raw material wherein the first vessel is a smelter and the first temperature range comprises a temperature range greater than the melting point of the solid phase raw material.

Aspect 8: The method of any of Aspects 1-7, wherein step b is performed in an absorption column.

Aspect 9: The method of any of Aspects 1-8, wherein step b is performed in the first vessel.

Aspect 10: The method of any of Aspects 1-9, wherein step b further comprises contacting the heated raw material with a getter selected from the group consisting of potassium chloride and sodium chloride.

Aspect 11: The method of any of Aspects 1-10, wherein step d further comprises wherein the second temperature range comprises a temperature range sufficient to cause the deposition of the second intermediate product to produce the product and to maintain the unreactive portion of the at least one impurity in a gaseous phase.

Aspect 12: The method of any of Aspects 1-11, wherein step d further comprises separating the second intermediate product from the unreactive portion of the at least one impurity by cooling the second intermediate product to a second temperature range to produce a product, wherein the product comprises less than 10 parts per million by weight of all at least one impurity.

Aspect 13: The method of any of Aspects 1-12, wherein step d further comprises separating the second intermediate product from the unreactive portion of the at least one impurity by cooling the second intermediate product to a second temperature range to produce a product, wherein the product comprises less than 5 parts per million by weight of all at least one impurity.

Aspect 14: The method of any of Aspects 1-13, wherein step b further comprises: wherein the getter comprises a concentration, the concentration comprising at least 0.1 percent by weight of the solid phase raw material.

Aspect 15: The method of any of Aspects 1-14, wherein the first pressure range comprises from 14.7 to 25 pounds per square inch absolute; the first temperature range comprises from 250 to 400 degrees Celsius and the second temperature range comprises from 130 to 250 degrees Celsius.

Aspect 16: The method of any of Aspects 1-15, wherein the first pressure range comprises from 100 to 500 torr absolute; the first temperature range comprises from 200 to 300 degrees Celsius and the second temperature range comprises from 60 to 200 degrees Celsius.

Aspect 17: The method of any of Aspects 1-16, wherein the first pressure range comprises less than 1 torr absolute; the first temperature range comprises from 130 to 250 degrees Celsius and the second temperature range comprises from 130 to 250 degrees Celsius.

Aspect 18: A purified tungsten (VI) chloride composition comprising at least one impurity, wherein the at least one impurity comprises less than 10 parts per million by weight of the purified tungsten (VI) chloride composition.

Aspect 19: A method of synthesizing high purity tungsten pentachloride, comprising:
- a.) adding a starting material comprising high purity tungsten hexachloride comprising less than 0.5 parts per million by combined weight of iron and molybdenum into a glass boiler container;
- b.) adding a getter selected from the group consisting of: potassium chloride; sodium chloride; rubidium chloride; cesium chloride; calcium chloride; magnesium chloride; barium chloride, and combinations thereof, in an amount equal to 0.1 to 10 percent by weight of the starting material;
- c.) heating the glass boiler container to 250 to 330 degrees Celsius to produce a tungsten hexachloride vapor;
- d.) directing a sweeping gas comprising 5 percent by volume of hydrogen in an inert gas into the glass boiler container at a flow rate sufficient to direct the tungsten hexachloride vapor into a tubular reactor heated to 400 degrees Celsius;
- e.) maintaining the flow rate sufficient to achieve a residence time of the tungsten hexachloride vapor in the tubular reactor to yield the conversion of the tungsten hexachloride vapor into a tungsten pentachloride vapor comprising less than 0.2 percent by weight of tungsten hexachloride;
- f.) condensing the tungsten pentachloride to yield a solid tungsten pentachloride composition.

Aspect 20: A purified tungsten (VI) chloride composition comprising at least one impurity, wherein the composition comprises a concentration of iron less than 0.5 parts per million and a concentration of molybdenum less than 0.5 parts per million.

Aspect 21: A system for purifying a solid phase raw material comprising tungsten hexachloride and at least one impurity comprising:
- a. at least one vessel adapted to heat the raw material causing vaporization and contact the vaporized raw material with a getter selected from the group consisting of: potassium chloride; sodium chloride; rubidium chloride; cesium chloride; calcium chloride; magnesium chloride; barium chloride, and combinations thereof;
- b. at least one separating vessel in fluid flow communication with the at least one vessel adapted to heat the raw material
- c. at least one condenser in fluid flow communication with the at least one separating vessel.

Aspect 22: A system for purifying a solid phase raw material comprising tungsten hexachloride and at least one impurity comprising:
- a. at least one vessel adapted to melt the raw material;
- b. at least one absorption column in fluid flow communication with the at least one vessel adapted to melt the raw material, the absorption column comprising a getter selected from the group consisting of: potassium chloride; sodium chloride; rubidium chloride; cesium chloride; calcium chloride; magnesium chloride; barium chloride, and combinations thereof;
- c. at least one separating vessel in fluid flow communication with the absorption column;
- d. at least one condenser in fluid flow communication with the at least one separating vessel.

Aspect 23: The method of claim 8 wherein step c further comprises directing the second intermediate product to a process tool.

DETAILED DESCRIPTION

Figure 1:
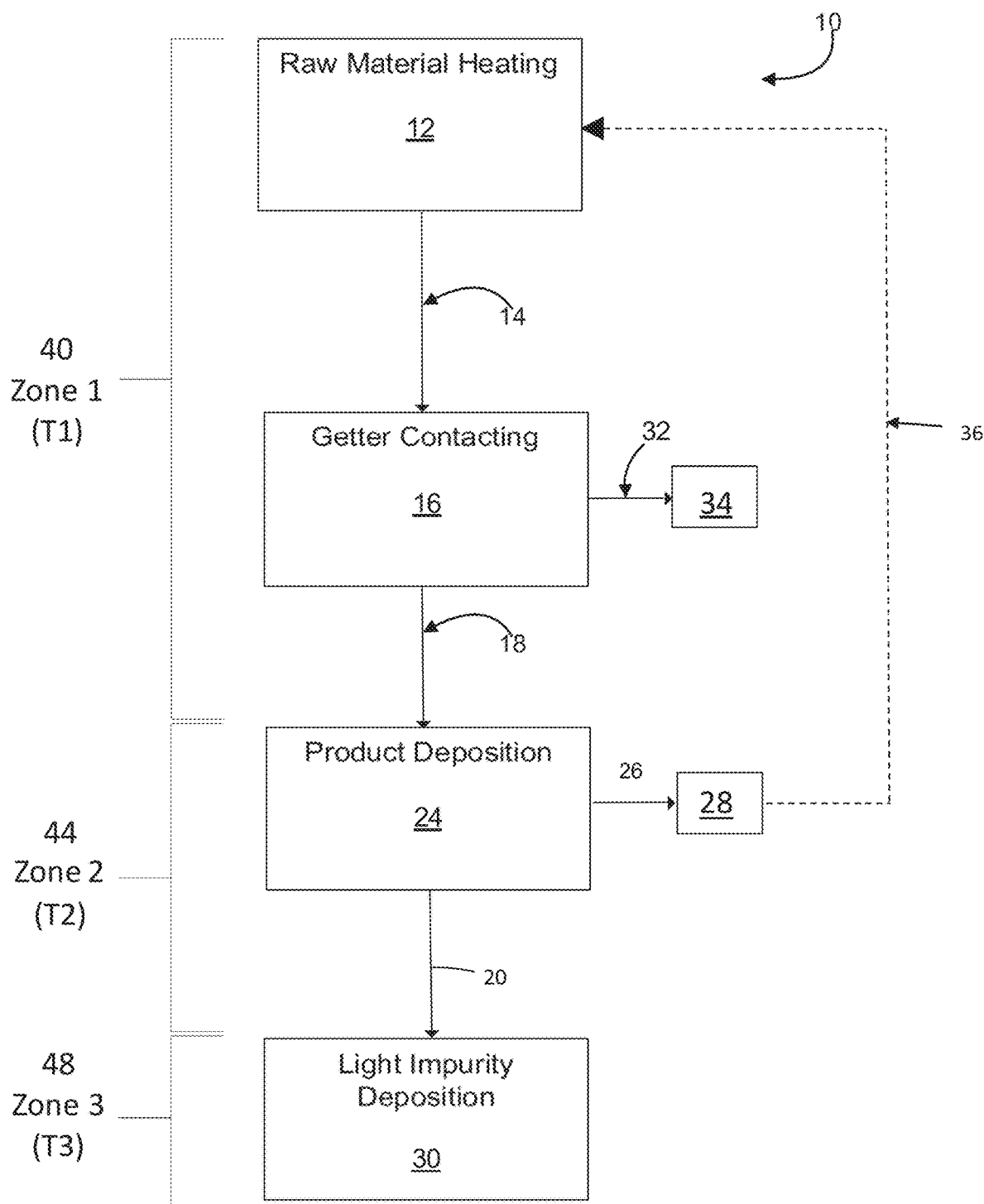
FIG. 1 is a flow chart showing the method steps in an exemplary embodiment of the invention.

The following disclosure is presented to provide an illustration of the general principles of the present invention and is not meant to limit, in any way, the inventive concepts contained herein. Moreover, the particular features described in this section can be used in combination with the other described features in each of the multitudes of possible permutations and combinations contained herein.

All terms defined herein should be afforded their broadest possible interpretation, including any implied meanings as dictated by a reading of the specification as well as any words that a person having skill in the art and/or a dictionary, treatise, or similar authority would assign particular meaning. Further, it should be noted that, as recited in the specification and in the claims appended hereto, the singular forms "a," "an," and "the" include the plural referents unless otherwise stated. Additionally, the terms "comprises" and "comprising" when used herein specify that certain features are present in that embodiment, but should not be interpreted to preclude the presence or addition of additional features, components, operations, and/or groups thereof.

The following disclosure is intended to be read in connection with the accompanying drawings, which are to be considered part of the entire written description of the invention. The drawing figures are not necessarily to scale and certain features of the invention may be shown exaggerated in scale or in somewhat schematic form in the interest of clarity and conciseness. In this description, relative terms such as "horizontal," "vertical," "up," "down," "top," "bottom," as well as derivatives thereof (for example, "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both moveable or rigid attachments or relationships, unless expressly described otherwise, and includes terms such as "directly" coupled, secured, etc. The term "operatively coupled" is such an attachment, coupling, or connection that allows the pertinent structures to operate as intended by virtue of that relationship.

In order to aid in describing the invention, the following terms are defined and used in the specification: The term "conduit," may be used in the specification and claims, refers to one or more structures through which fluids can be transported between two or more components of a system. For example, conduits can include pipes, ducts, passageways, and combinations thereof that transport liquids, vapors, and/or gases.

The term "flow communication," as used in the specification and claims, refers to the nature of connectivity between two or more components that enables liquids, vapors, and/or gases to be transported between the components in a controlled fashion (for example, without leakage). Coupling two or more components such that they are in flow communication with each other can involve any suitable method known in the art, such as with the use of welds, flanged conduits, gaskets, and bolts.

As used herein, the abbreviation "ppm" refers to parts per million by weight, unless otherwise specified, the term "percent" refers to percent by weight, unless otherwise specified. As used herein, the abbreviation "psi abs" refers to pounds per square inch absolute The section headers used herein are for organizational purposes only and are not intended to limit the scope of the invention.

As used herein, the terms "volatile" and "volatility" have their ordinary meaning in the chemical arts, namely, a quality which describes how readily a substance vaporizes. Volatility itself has no defined numerical value, but it is described in terms vapor pressures or sublimation points (for solids). High vapor pressures indicate a high volatility, while high sublimation points indicate low volatility. The terms "volatile," "non-volatile," "less volatile" and "more volatile" used herein in relation to a material are intended to be interpreted in reference to the volatility of another material or to a given set of temperature and pressure conditions.

The terms "sublimer" and "sublimator" refer to any sublimation apparatus known in the art.

The term "ultrapure tungsten chloride" refers to tungsten chloride having concentrations of iron and molybdenum that are each less than 10 ppm, preferably less than 5 ppm, more preferably less than 1 ppm and most preferably less than 0.5 ppm. The ultrapure tungsten chloride also has less than 10 ppm and preferably less than 5 ppm of all other trace metals combined.

As used herein, "trace metals" are defined as aluminum, arsenic, calcium, cobalt, chromium, copper, potassium, magnesium, manganese, sodium, nickel lead, antimony, tin, titanium and zinc.

The term "nonvolatile impurities" used herein in relation to tungsten chloride raw material refers to impurities that are less volatile than the target tungsten chloride compound being purified. The term "light impurities" used herein in relation to tungsten chloride raw material refers to impurities that are more volatile than the target tungsten chloride compound being purified.

As used herein the term "WClx" is a general formula for tungsten chloride wherein x has a value from 1 to 6. The term "tungsten chloride" refers to any compound consisting of tungsten and chlorine, including dimer forms.

The term "inert gas" used herein refers to any gas that does not undergo reactions under the process conditions. Preferred inert gases include, but are not limited to nitrogen, helium, neon argon and combinations thereof.

The methods described in the present invention relate generally to the removal of impurities from a solid phase raw material comprising tungsten chloride through phase changing processes to produce an ultrapure tungsten chloride. While researching purification methods to achieve levels of purity not possible with prior art methods, the inventors of the present invention surprisingly discovered that specific combinations of phase changing strategies were able to provide levels of purity orders of magnitude greater than prior art methods.

Method Overview

The ultra-high purity tungsten chlorides produced by the methods and systems disclosed herein use a stepwise process of separations and phase changes to achieve a final product with impurity concentrations below 10 ppm. The starting material is preferably a solid phase raw material comprising at least 80 percent by weight of tungsten chloride and at least one impurity. A portion of the at least one impurity is reacted with a getter to form complexes with reduced volatility to facilitate its separation from the tungsten chloride to be purified. This portion of the of the impurities are referred to herein as complexed impurities, heavy impurities and non-volatile impurities. A portion of the at least one impurity does not react with the getter and is referred to herein as the unreactive portion of the at least one impurity, light impurities or non-condensed impurities.

One challenge in preparing ultrapure tungsten chloride is to remove volatile Fe, Mo, and Al chlorides from the raw material to yield a product where these impurities are present below 10 ppm, preferably below 5 ppm and more preferably below 1 ppm in the final tungsten chloride final product. According to the Thiele-McCabe method, separation of a binary system at low ppm levels requires many theoretical plates, which are not available using a vacuum sublimation, alone, or a fluidized bed system, alone. Therefore, a getter, preferably, but not limited to, NaCl or KCl, is used to complex the volatile metal chloride impurities to form less volatile salts. These less volatile salts are separated from more volatile tungsten chloride by sublimation or distillation. Any metal chloride which forms a less volatile complex with a targeted impurity can be used as a getter. Examples of preferred metal chlorides which can be used as a getter include, but are not limited to NaCl, KCl, RbCl, CsCl and $BaCl_2$.

Another challenge in preparing ultrapure tungsten chloride is to remove light impurities which cannot be targeted by the getter, such as tungsten oxytetrachloride ($WOCl_4$). These impurities can be separated through sublimation by utilizing the different sublimation points of product and impurities, through providing at least two temperature zones. Similarly, such separation can be achieved by utilizing different vapor pressure at a fixed temperature and carrying low boiling impurities away with inert gas. For example, at 150 degrees Celsius, the vapor pressure of $WCl_6$ is 1.73 torr, whereas for $WOCl_4$ it is 21.37 torr. By providing a suitable amount of inert gas, the $WOCl_4$ can be kept in gaseous phase while most $WCl_6$ can be condensed, achieving separation.

FIG. 1 is a flow chart that provides an overview of an embodiment of the purification system 10 and method. A solid phase raw material 12 preferably contains at least 80 percent by weight of a target tungsten chloride, preferably tungsten hexachloride or tungsten pentachloride, with the balance of the raw material weight consisting of impurities. The impurities include, but are not limited to, trace metals, tungsten oxytetrachloride, tungsten oxide and tungsten tetrachloride. The solid phase raw material and impurities are heated 12 in a first temperature zone T1 40 to produce a heated raw material. In some embodiments the temperature to which the raw material is heated to a temperature sufficient to vaporize volatile tungsten compounds in the raw material. In some embodiments the raw material is heated to a temperature sufficient to melt tungsten compounds in the raw material.

The vaporized raw material 14 is contacted with a getter in a second vessel 16 subsequent to vaporization as shown in FIG. 1. In some embodiments the raw material heating 12 and getter contacting 16 is performed simultaneously in the same vessel. Some volatile impurities, including metal chlorides such as, react with the getter 16 to form complexed impurities that have sublimation point greater than the sublimation point of the target tungsten chloride being purified, and a first intermediate product enriched in the target tungsten chloride.

The complexed, non-volatile impurities are separated from the first intermediate product by sublimation or distillation to produce a second intermediate product 18 that is enriched in tungsten chloride. The complexed impurities, also referred to as non-volatile impurities, are left behind either in the heating vessel as heel, or in the getter contact vessel. The complexed, non-volatile impurities 32 are ultimately removed 34 from the system as waste. In embodiments where an absorption column is used, the column would need to be replaced after a period of use.

Other impurities in the solid phase raw material have a higher volatility than the target tungsten chloride and do not react with the getter. These impurities are referred to herein as light, volatile, or non-condensed impurities. An example of a light impurity is tungsten oxytetrachloride ($WOCl_4$). The light impurities remain mixed with the vaporized first intermediate product 18. Up to this point in the process, the process is performed in the first temperature zone 40, Zone 1, having a temperature range of T1.

The second intermediate product and light impurities are then fed into a collecting vessel 24 that is maintained in a second temperature zone 44, Zone 2, having a temperature range of T2. T2 is preferably a lower temperature range than T1 and is sufficient to cause deposition of tungsten chloride while maintaining the light impurities in the gaseous phase. Proper selection of T2 separates the second intermediate product from the light impurities by selective deposition of the second intermediate product to produce a product that is a solid phase ultrapure tungsten chloride 26. The solid phase ultrapure tungsten chloride final product is collected and harvested 28.

The light, non-condensed impurities remain vaporized in Zone 2 and pass into a third, lower temperature zone 48, Zone 3, having a temperature range of T3, where the light impurities are deposited in a vessel for light impurity collection 30.

Through careful control of the temperature zones and the selection of appropriate getters, the disclosed method yields ultrapure tungsten hexachloride and tungsten pentachloride containing concentrations of iron and molybdenum that are each less than 10 ppm, preferably less than 5 ppm, more preferably less than 1 ppm and most preferably less than 0.5 ppm. The high purity tungsten chloride product contains less of 10 ppm and preferably less than 5 ppm of all other trace metals combined. Optionally, the ultrapure tungsten chloride final product 28 may be fed back 36 into the first vessel 12 for further purification.

In some embodiments, getter contacting is performed in the same vessel, where solid phase getter is mixed with the solid phase raw material comprising tungsten chloride and loaded into a sublimer as a solid mixture. In other embodiments, the solid phase raw material comprising tungsten chloride is loaded into the sublimer, and a thin layer of solid phase getter is added on top of the raw material, and the vapor is passed through the layer of getter during purification. In other embodiments, getter contacting is performed in a second vessel, preferably an absorption column filled with a getter inserted into the connecting conduit between the sublimer and the condenser. Yet in other embodiments, molten tungsten chloride is passed through an absorption column filled with getter and fed into the sublimer.

Purification System Using an Absorption Column Filled with a Getter

In embodiments, the purification system comprises a series of at least three vessels in flow communication: a sublimer where the raw material is vaporized, a condenser where the purified product is collected, and a cooler where light impurities are collected. In embodiments with only these three vessels, the getter is added to the sublimer. In preferred embodiments, the getter is not added to the sublimer and an absorption column filled with getter is inserted between the sublimer and the condenser. Each of the vessels are maintained in temperature zones which are controlled to achieve the phase changes that result in purification.

Figure 2:
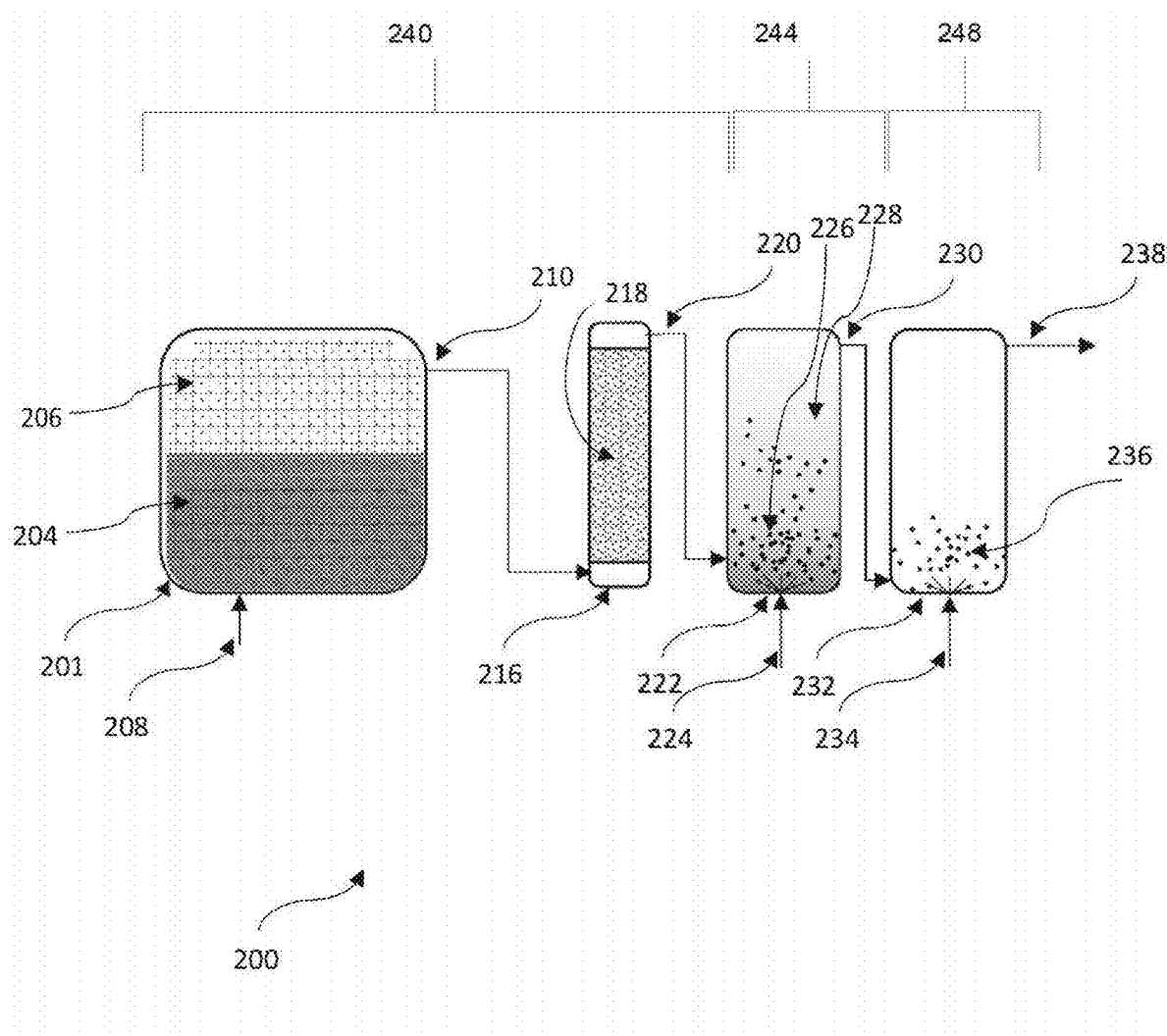
FIG. 2 is an exemplary purification system using an absorption column filled with a getter according to certain embodiments of the invention.

An embodiment of the purification system that incorporates an absorption column is shown in FIG. 2. In this embodiment of the purification system 200, at least one sublimer 201, is filled with a solid phase raw material 204 comprising tungsten chloride (WClx) and at least one impurity. The raw material preferably comprises 80 to 90 percent by weight of $WCl_6$ or $WCl_5$, the balance of the raw material weight consisting of impurities.

The sublimer has an inlet 208, which in some embodiments can be used for the introduction of an inert carrier gas to drive the flow of vapor through the purification system. The sublimer is heated to a predetermined temperature, T1 240, causing the raw material to vaporize and generate a raw material vapor 206. The raw material vapor will comprise tungsten chloride and volatile impurities. The raw material vapor is then directed through a heat traced conduit 210 into an absorption column 216 filled with a getter 218, preferably in powder or pelletized form. The absorption column is also heated to equal or higher than the temperature of the sublimer, but within the range of T1 240.

The getter 218 in the absorption column 216 forms complexes with some of the volatile impurities, including but not limited to chlorides of Fe, Mo, and Al, lowering their volatility and producing a first intermediate product enriched in tungsten chloride. T1 is controlled to selectively trap the complexed impurities in the absorption column 216. As a result of the absorption of the complexed impurities from the vaporized first intermediate product stream, a second intermediate product enriched in tungsten chloride is produced. Volatile, or light, impurities that do not complex with the getter remain mixed with the second intermediate product The second intermediate product and light impurities pass through the absorption column 216, and directed through a heat traced conduit 220 into a condenser 222, which is maintained at a temperature T2 244. The condenser may be configured with an inlet 224 for a stream of cold inert gas to promote deposition of the purified product. The temperature T2 in the condenser 222 is controlled to deposit and separate the second intermediate product from the light impurities to cause the deposition of an ultrapure tungsten chloride final product 226 while maintaining the light impurities in a non-condensed gaseous phase 226. The deposited ultrapure tungsten chloride final product is collected and may optionally be reintroduced to the sublimer 201 as raw material for further purification.

The non-condensed light impurity 228 is fed via a conduit 230 into a cooler 232 which is maintained at a temperature T3 248 that is lower than the temperature of T2. The cooler may have an inlet 234 for cold inert gas to promote the deposition of the light impurities to produce a solid light impurity 236. The cooler has an outlet 238 that in some embodiments is collected to a vacuum source to drive the flow of vapor through the purification system.

Operation of the Purification System

In certain embodiments, the vaporized raw material and volatile impurities are forced to pass through vessels by applying vacuum. Referring to FIG. 2, the outlet of the system 238 is connected to a vacuum source for this mode of operation. In other embodiments, the vaporized materials are forced to pass through vessels by inert carrier gas flow. This preferably is done by supplying an inert gas, preferably N2, to the system inlet 208 under a slight positive pressure. In some embodiments, both vacuum and inert gas flow can be applied simultaneously to force the flow of vaporized material.

In embodiments of the purification system, including the embodiment of FIG. 2, the preferred temperature profiles for each temperature zone are determined by the pressure under which is system is operated. As described in reference to FIGS. 1 and 2, the components of the purification system can be divided into three temperature zones. The sublimer 201, the absorption column 206 (if used), together with connecting conduits 210, 220 make up zone 1 and are maintained at temperature range T1, generally the highest temperature range in the purification system during operation. The condenser 222 and the effluent conduit 230 form zone 2 which is operated at temperature range T2. In some embodiments, the temperature of T2 is maintained constant, and in other embodiments the temperature is varied. Preferably, the T2 temperature range is lower than T1 and greater than T3. The cooler 232 and outlet 238 form zone 3 and maintained at T3, the lowest temperature in the purification system.

In some embodiments, the purification system is operated under positive pressure (14.7-25 psi abs). Under this pressure condition, the preferred operation temperature for Zone 1 is from 250 to 400 degrees Celsius, preferably from 270 to 380 degrees Celsius, and more preferably from 280 to 360 degrees Celsius. In some embodiments, the temperature of Zone 2 is varied during operation. A preferred startup operation temperature for Zone 2 is from 80 to 250 degrees Celsius, more preferably from 100 to 200 degrees Celsius, and most preferably from 110 to 160 degrees Celsius, to remove the light impurities. After the light impurities are removed, a preferred operation temperature for Zone 2 is from 50 to 150 degrees Celsius, more preferably from 60 to 140 degrees Celsius, and most preferably from 80 to 130 degrees Celsius. The preferred operation temperature for Zone 3 at this pressure condition is below 50 degrees Celsius at all times.

In other embodiments, the purification system is operated under medium vacuum (100-500 torr abs). The preferred operation temperature for Zone 1 is from 200 to 300 degrees Celsius, preferably from 220 to 280 degrees Celsius, and more preferably from 240 to 260 degrees Celsius. The preferred startup operation temperature for Zone 2 is from 60 to 200 degrees Celsius, preferably from 70 to 150 degrees Celsius, and more preferably from 80 to 110 degrees Celsius, to remove the light impurities. After the light impurities are removed, the preferred operation temperature for Zone 2 is from 20 to 100 degrees Celsius, preferably from 30 to 90 degrees Celsius, and more preferably from 40 to 80 degrees Celsius. The preferred operation temperature for Zone 3 at this pressure condition is below 40 degrees Celsius at all times.

In some embodiments, the purification system is operated under deep vacuum (less than 1 torr absolute) is used for operation. The preferred operation temperature for Zone 1 is from 130 to 250 degrees Celsius, preferably from 150 to 240 degrees Celsius, and more preferably from 180 to 220 degrees Celsius. The preferred startup operation temperature for Zone 2 is from 130 to 250 degrees Celsius, preferably from 150 to 240 degrees Celsius, and more preferably from 150 to 220 degrees Celsius, to remove the light impurities. After the light impurities are removed, the preferred operation temperature for Zone 2 is from 20 to 150 degrees Celsius, preferably from 20 to 130 degrees Celsius, and more preferably from 20 to 120 degrees Celsius. The preferred operation temperature for Zone 3 is below 30 degrees Celsius at all times.

In certain embodiments, the vessels of the purification system are maintained at fixed temperature. In other embodiments, some vessels may vary temperature during the purification process, to allow for better separation of light impurities. In some embodiments, the light impurity vapor (205) can pass the condenser by maintaining the condenser at high temperature at the beginning of the process, for example, the same temperature as the sublimer. Once all the light impurities have been vaporized and passed through the condenser, the condenser temperature is reduced to cumulate product. In other embodiments when cooling gas is used to condense the product, the condenser temperature can be maintained at a fixed level under which the impurity vapor pressure is higher than the impurity concentration in the gaseous phase, and hence no impurity will condense in the condenser.

In certain embodiments, the ultrapure tungsten chloride final product and light impurities are condensed by cold surfaces in the condenser and cooler, respectively. In other embodiments, the final product and light impurities are condensed in their respective vessels by a cold inert gas 224, 234. When condensed by cold inert gas, the condenser can be made into a fluidized bed, so the product condensed in the gas stream can become a nucleation seed and promote crystal growth. By controlling the residence time in the fluidized bed, uniform product particle size and uniform solid product purity can be achieved.

In embodiments utilizing a fluidized bed an important element to achieving a good yield and economic efficiency is to control the ratio of inlet fluidizing gas to the inlet of the vaporized second intermediate product enriched in tungsten chloride at the bottom of the condenser. It is important to keep the ratio low, so carryover of product by the gas is limited. Since this gas stream is also a cooling source for the inlet vapor, there is a lower limit for the ratio according to mass and heat balance. In general, the fluidizing gas will be heated primarily by the latent heat released from crystallization. Preferably, in purifying tungsten hexachloride in the above-mentioned temperature ranges, using ambient temperature N2 gas as the inlet fluidizing gas, the molar ratio of inlet fluidizing gas to $WCl_6$ vapor should be less than 200:1, more preferably less than 150:1, and most preferably less than 120:1. In certain embodiments, other inert gases may be used as the inlet fluidizing gas, as long as it will not react with the tungsten chloride. Inert gases with high heating capacity are more preferable for keeping the ratio low.

Alternatively, pre-cooling the fluidizing gas will also add more cooling capacity, and hence reduce the ratio.

Another factor in achieving good crystal growth and high yield is to feed the condenser with a high concentration of vapor. This can be achieved by providing a high temperature to the sublimer or limiting the carrier gas supplied to the sublimer. A combination of both options is preferred. In operation, it is preferable to keep the carrier gas to vapor boil up ratio to less than 10:1, more preferably less than 5:1, and most preferably less than 2:1, in molar units. The sublimer should preferably be heated to the upper limit possible, depending on the operation pressure. With a high vapor concentration in the feed, less process residence time is achieved for the same amount of raw material, leading to less carryover of material as the total amount of gas passed through is reduced.

In certain embodiments, the absorption column is inserted into a connecting conduit between the first vessel filled with tungsten chloride (the sublimer or smelter) and the point of use of tungsten chloride, for example a vessel for deposition of tungsten-containing film from tungsten chloride. In such embodiments, the process provides a source of high purity tungsten chloride vapor directly to the deposition tool.

Purification System Using Raw Material and Getter in the Sublimer

Figure 3A:
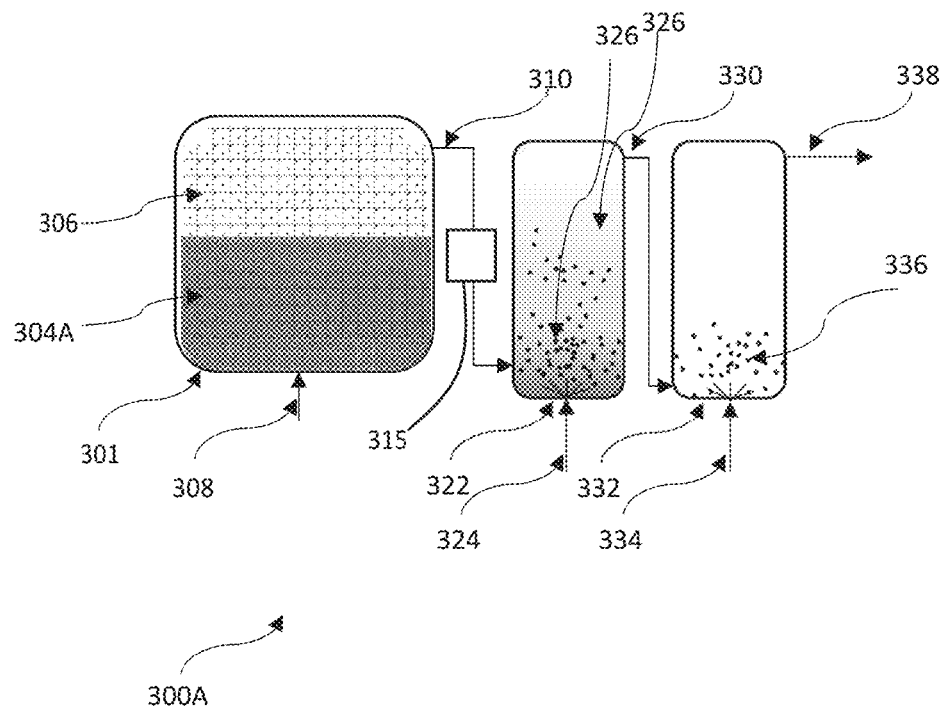
FIG. 3a is an exemplary purification system that does not use an absorption column and where a getter is mixed with the tungsten chloride raw material in the sublimer according to certain embodiments of the invention.

Another embodiment of the present invention is shown in FIG. 3A. In this embodiment the purification system 300A comprises three vessels, the sublimer 301 the condenser 322 and the cooler 332. Other callouts in FIG. 3A are analogous to the parts with corresponding callout numbers in FIG. 2 and their function is not repeated here. The sublimer 301 is filled with a solid phase mixture 304A of getter and solid phase tungsten chloride raw material. Upon heating of the sublimer, the contact between the getter and tungsten chloride raw material results in a reacton between the getter and volatile metal chloride impurities in the tungsten chloride raw material to produce non-volatile impurity complexes which remain in the getter. In this embodiment, the tungsten chloride raw material is preferably pre-mixed with at least 0.1 weight percent of a getter, preferably KCl or NaCl. More preferably, the tungsten chloride raw material is mixed with at least 1 weight percent of KCl or NaCl, and most preferably at least 10 weight percent of KCl or NaCl.

Figure 3B:
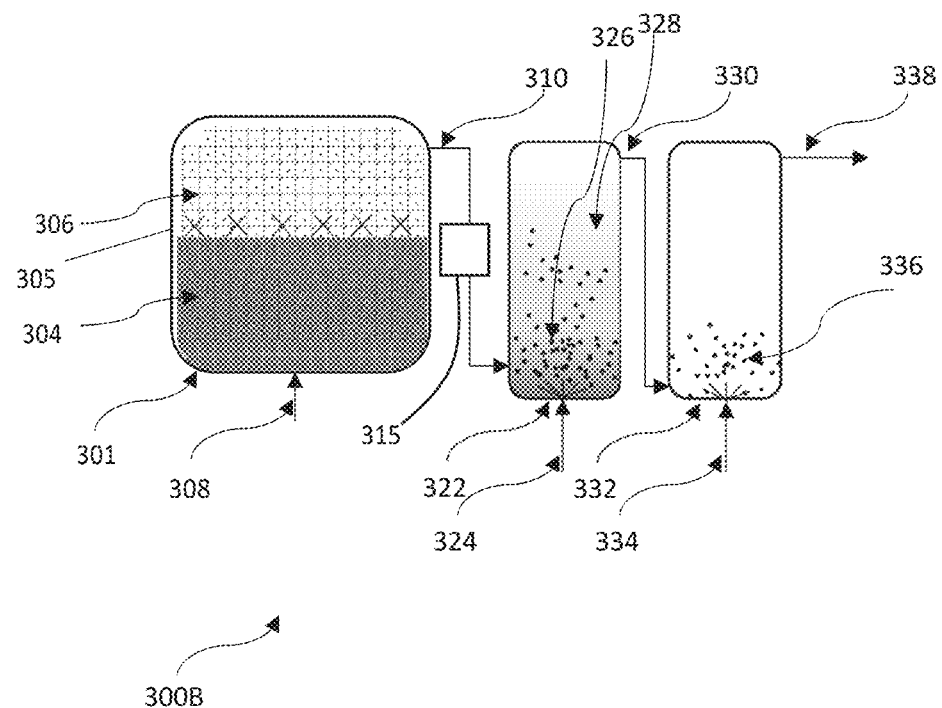
FIG. 3b is an exemplary purification system that does not use absorption column and getter is layered on top of the tungsten chloride raw material in the sublimer according to certain embodiments of the invention.

In another embodiment, shown in FIG. 3B, the purification system 300B also comprises 3 vessels, as in FIG. 3A. However, in this embodiment the sublimer 301 is assembled in a way that the tungsten chloride raw material 304 is first added into the sublimer 301, and a layer of getter 305, preferably KCl or NaCl, is added on top of the tungsten chloride raw material, so that, upon heating, the vapor of the tungsten chloride raw material must pass through this layer, resulting in reaction of the getter and volatile metal chloride impurities in the tungsten chloride raw material to produce non-volatile impurity complexes. Other callout numbers in FIG. 3B are analogous to the parts with corresponding callout numbers in FIG. 2 and their function is not repeated here.

Referring to FIGS. 3A and 3B, it is possible that during the sublimation of tungsten chloride raw material in the sublimer 301, that the material cumulates static charge which can send particles of raw material directly into the condenser 322, consequently contaminating the purified final product. Particle carryover can also happen when the mass flow rate is significant, such as in the case in embodiments utilizing a fluidized bed in the condenser 322. In certain embodiments, a particle trap 315 is present in the conduit 310 between the sublimer 301 and the condenser 322. In embodiments, the particle trap 315 preferably comprises baffle plates or bent connecting conduit which change the vapor flow direction. In some embodiments the particle trap 315 may comprise a filter. A preferred filter pore size is 100 microns. In certain embodiments, ground metal can be provided to discharge the static charge to prevent the particle carry over. In certain embodiments, a combination of a lower degree of vacuum or carrier gas flow and higher subliming temperature is preferably used to reduce mass flow rate.

Purification System Using a Smelter

Figure 4:
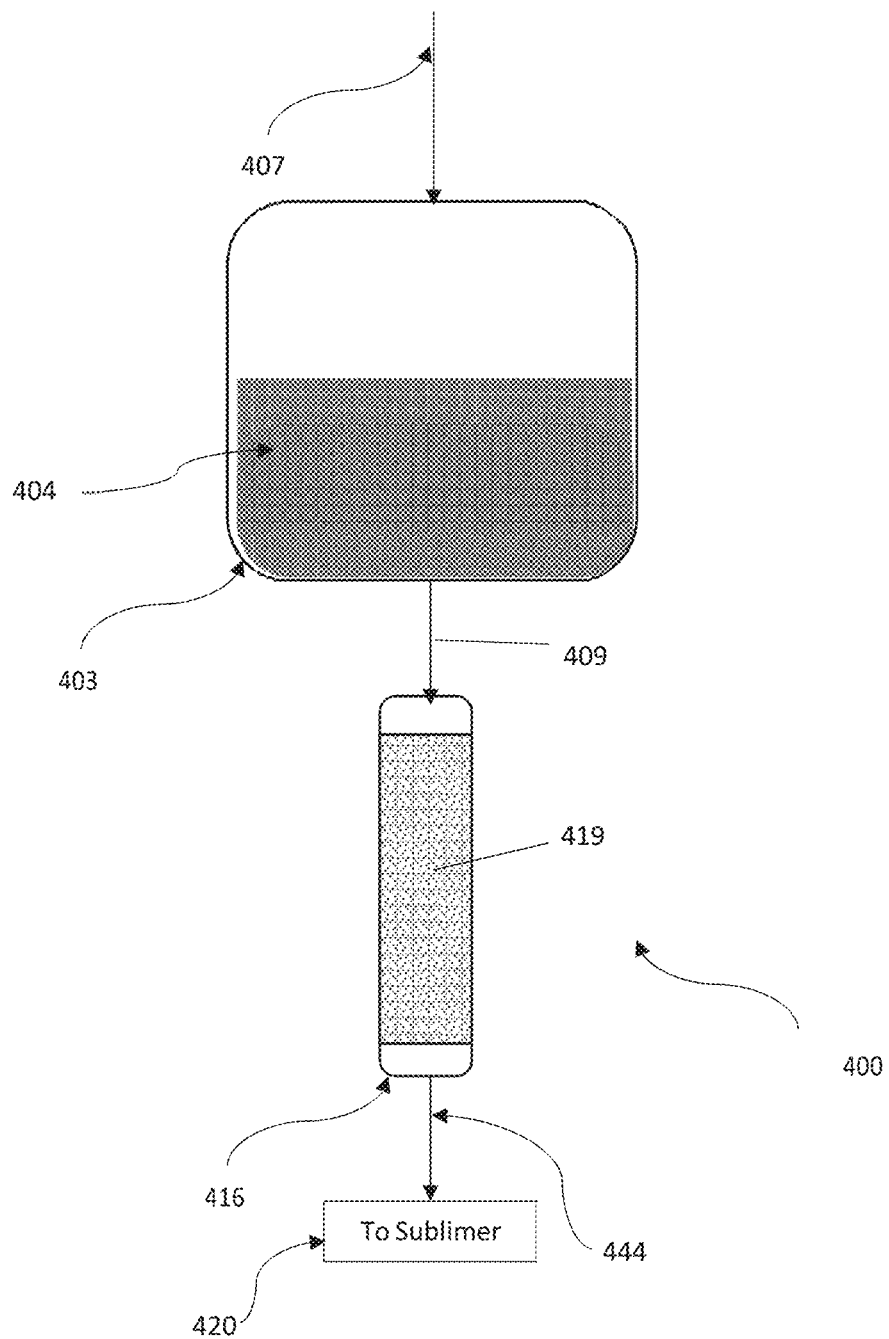
FIG. 4 is a diagram of a portion of an exemplary purification system using an absorption column for molten tungsten chloride raw material according to certain embodiments of the invention.

Another embodiment of the purification system 400 is shown, in part, in FIG. 4. In this embodiment, the first vessel is a smelter 403. Solid phase tungsten chloride raw material 404 is melted into molten phase in a smelter 403. The molten liquid is then fed through a conduit 409 through an absorption column 416, filled with getter 419, preferably KCl or NaCl, preferably in powder or pellet form. In an embodiment, the molten liquid flow is gravity driven, and in other embodiments the molten liquid flow is driven by an inert carrier gas, preferably nitrogen, supplied through inlet 407. Preferably, all components shown in FIG. 4, including the smelter 403, the absorption column 416 the connecting conduit 409 and the outlet 444, are kept at temperature above the melting point for the particular tungsten chloride being purified. The effluent from the outlet 444 of the absorption column can be directly fed into the sublimer 201, 301 shown in any of the embodiments of FIG. 2, 3A or 3B, or any other embodiment envisioned by one of skill in the art. In some embodiments the effluent is condensed into a solid before being fed into sublimer. In embodiments, the purification process then proceeds according to any of the embodiments described above.

Purification of Tungsten Pentachloride

The purification of tungsten hexachloride through the removal of iron trichloride and molybdenum chlorides using non-volatile metal chloride getters such as KCl or NaCl, is more effective compared to the purification of tungsten pentachloride. Without being bound by any theory, it is believed that this is due to the formation of stronger complexes between tungsten pentachloride and alkali metal chlorides, $KWCl_6$ or $NaWCl_6$, compare to weaker complex between tungsten hexachloride or tungsten pentachloride and alkali metal chlorides, $KWCl_7$ and $NaWCl_7$. The formation of such stronger complex reduces the efficiency of iron and molybdenum removal from tungsten pentachloride.

In an embodiment, a high purity tungsten hexachloride or tungsten pentachloride containing less than 10 ppm of iron and more preferably less than 1 ppm of iron and molybdenum is used to prepare ultrahigh purity tungsten pentachloride by a reduction process.

In one embodiment, high purity tungsten hexachloride or tungsten pentachloride comprising less than 1 ppm of iron and molybdenum impurities is heated to 200-400 degrees Celsius in the presence of a carrier gas comprising hydrogen to obtain ultra-high purity tungsten pentachloride comprising less than 1 ppm of iron and molybdenum impurities. In another embodiment tungsten hexachloride or tungsten pentachloride containing less than 1 ppm of iron and molybdenum impurities is dissolved in inert solvent is treated with reducing agent to obtain high purity tungsten pentachloride containing less than 1 ppm of iron. Inert solvents include but are not limited to toluene, xylene, mesitylene and halocarbon solvents comprising dichloromethane, carbon tetrachloride, chloroform, and combinations thereof. Reducing agents include but are not limited to cyclic and aliphatic alkenes, tetrachloroethylene, and other halogenated alkenes.

In an embodiment a method of synthesizing high purity tungsten pentachloride uses a getter in contact with a raw material. A raw material comprising high purity tungsten hexachloride comprising less than 0.5 parts per million by weight of iron and less than 0.5 parts per million by weight of molybdenum is placed into a glass boiler container. A getter, preferably selected from the group consisting of: potassium chloride; sodium chloride; rubidium chloride; cesium chloride; calcium chloride; magnesium chloride; barium chloride, and combinations thereof, is added to the glass boiler container in an amount equal to 0.1 to 10 percent by weight of the raw material. The glass boiler container is heated to 250 to 330 degrees Celsius to produce a tungsten hexachloride vapor. A sweeping gas comprising 5 percent by volume of hydrogen in an inert gas is directed into the glass boiler container at a flow rate sufficient to direct the tungsten hexachloride vapor into a tubular reactor heated to 400 degrees Celsius. The flow rate is maintained sufficient to achieve a residence time of the tungsten hexachloride vapor in the tubular reactor to yield the conversion of the tungsten hexachloride vapor into a tungsten pentachloride vapor comprising less than 0.2 percent by weight of tungsten hexachloride. The tungsten pentachloride is condensed to yield a solid tungsten pentachloride composition.

Any of the above features can be combined with any of one or more other features. Other advantages, novel features, and uses of the present disclosure will become more apparent from the following detailed description of non-limiting embodiments when considered in conjunction with the accompanying drawings, which are schematic, and which are not intended to be drawn to scale or to exact shape. In the figures, each identical, or substantially similar component that is illustrated in various figures is typically represented by a corresponding numeral or notation. For purposes of clarity, not every component is labeled in every figure, nor is every component of each embodiment shown where illustration is not necessary to allow those of ordinary skill in the art to understand the invention.

All examples and conditional language recited herein are intended for pedagogical purposes to aid the reader in understanding the principles of the present invention and the concepts contributed by the inventor in furthering the art. As such, they are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, for example, any elements developed that perform the same function, regardless of structure.

It is to be understood that the embodiments described herein are merely exemplary and that a person skilled in the art may make many variations and modifications without departing from the spirit and scope of the invention. All such variations and modifications are intended to be included within the scope of the invention, as defined by the following claims.

EXAMPLES

Example 1 Purification of Tungsten Hexachloride in the Presence of Sodium Chloride 63.6 g of crude tungsten hexachloride was mixed with 6.3 g of pre-dried sodium chloride and loaded into glass sublimer. The sublimer was pre-heated to 250 degrees Celsius for two hours under a nitrogen atmosphere and ambient pressure. After this step, the sublimer was cooled to 180 degrees Celsius and placed under 80 mtorr vacuum to collect purified tungsten hexachloride on a cold finger cooled with a flow of room temperature nitrogen gas. After 2 hours of sublimation 60 g of purified tungsten hexachloride was collected on the cold finger.

Trace metals analysis by Inductively-coupled plasma mass spectrometry (ICP-MS) showed significant reductions in iron, chromium, nickel and copper, as shown in Table 1.

TABLE 1

| | Content in Tungsten Hexachloride, ppm | | |
|---|---|---|---|
| Element | Starting Material | 1st sublimation | Second sublimation |
| Fe | 8.48 | 1.56 | 0.9 |
| Cr | 1.89 | 0.37 | 0.11 |
| Ni | 2.04 | 0.56 | 0.15 |
| Cu | 0.53 | 0.16 | 0.09 |

55 g of purified tungsten hexachloride from the first sublimation was mixed with 5.5 g of pre-dried sodium chloride and the sublimation was repeated according to procedure described above. Trace metals analysis by ICP-MS showed a further reduction in iron, chromium, nickel and copper, as shown in Table 1.

Example 2. Purification of Tungsten Hexachloride in the Presence of Potassium Chloride Crude tungsten hexachloride was mixed with various amounts of pre-dried potassium chloride to study the effect of potassium chloride loading on purification of tungsten hexachloride from trace impurities. Two mixtures were pre-ground using mortar and pestle to achieve better contact between tungsten hexachloride and potassium chloride. The mixtures were pre-heated at 250 degrees Celsius for 2 hours. Tungsten hexachloride was sublimed from the mixtures at 180 degrees Celsius under 50-80 mtorr vacuum for 2 hours.

Purified tungsten hexachloride was collected on a cold finger and analyzed for trace metals using ICP-MS method. The dependence of trace metals removal on potassium chloride loading was shown in table 2.

TABLE 2

| Exp. # | $WCl_6$, g | KCl, g | KCl conc., wt. percent | Grinding | Fe | Cr | Ni | Cu | Mo |
|---|---|---|---|---|---|---|---|---|---|
| 0 | NA, starting material | | | NA | 8.48 | 1.89 | 2.04 | 0.53 | 2.08 |
| 1 | 50.50 | 5.12 | 9.2 | yes | 0.37 | 0.09 | 0.06 | 0.10 | ND |

TABLE 2-continued

| Exp. # | WCl$_6$, g | KCl, g | KCl conc., wt. percent | Grinding | Fe | Cr | Ni | Cu | Mo |
|---|---|---|---|---|---|---|---|---|---|
| 2 | 34.94 | 0.40 | 1.1 | yes | 0.52 | 0.96 | 0.22 | 0.06 | 0.07 |
| 3 | 52.97 | 0.54 | 1.0 | no | 0.60 | 0.99 | 0.23 | 0.09 | 0.07 |
| 4 | 49.95 | 0.05 | 0.1 | no | 1.62 | 1.01 | 0.37 | 0.28 | 0.18 |

The results showed that the method demonstrated high purity tungsten hexachloride with iron content less than 0.5 ppm and molybdenum content less than 0.1 ppm. Higher potassium chloride loading improves purification of tungsten hexachloride from trace metals. Grinding the mixture has no obvious impact on purification efficiency.

Example 3. Synthesis of High Purity Tungsten Pentachloride

High purity tungsten hexachloride containing less than 0.5 ppm of iron and molybdenum impurities was loaded into glass boiler container and was heated to 290 degrees Celsius. 1 standard liter per minute (SLPM) of sweeping gas comprising 5 vol. percent of hydrogen was supplied to the container to carry the vapor into tubular reactor heated to 400 degrees Celsius. The flow rate and vapor residence time were maintained to complete conversion of tungsten hexachloride into tungsten pentachloride. High purity tungsten pentachloride was collected from the cooled condenser. The amount of iron and molybdenum impurities in purified tungsten pentachloride was measured to be less than 0.5 ppm.

Example 4. Synthesis of High Purity Tungsten Pentachloride

High purity tungsten hexachloride containing less than 0.5 ppm of iron and molybdenum impurities was loaded into glass boiler container. 0.1 to 10 wt. percent of KCl or NaCl was added to the boiler and the boiler was heated to 290 degrees Celsius. 1 SLPM of sweeping gas comprising 5 percent by volume of hydrogen was supplied to the container to carry the vapor into tubular reactor heated to 400 degrees Celsius. The flow rate and vapor residence time were maintained to complete conversion of tungsten hexachloride into tungsten pentachloride. High purity tungsten pentachloride was collected from the cooled condenser. The amount of iron and molybdenum impurities in purified tungsten pentachloride was measured to be less than 0.5 ppm.

The invention claimed is:

1. A method of purifying a solid phase raw material comprising tungsten chloride and at least one impurity, wherein the at least one impurity is neither iron chloride nor aluminum chloride, comprising:
(a) heating the solid phase raw material in a first vessel to a first temperature range to produce a heated raw material;
(b) contacting the heated raw material with a getter, which results in a reaction between the getter and a reactive portion of the at least one impurity to produce at least one complexed impurity and produces a first intermediate product, comprising tungsten chloride, an unreactive portion of the at least one impurity, and the at least one complexed impurity, and the getter is selected from the group consisting of: potassium chloride, sodium chloride, rubidium chloride, cesium chloride, calcium chloride, magnesium chloride, barium chloride, and combinations thereof;
(c) performing a separation process on the first intermediate product which results in at least a portion of the at least one complexed impurity being separated from the tungsten chloride and the unreactive portion of the at least one impurity to produce a second intermediate product, the separation process selected from the group consisting of: distillation and sublimation;
(d) cooling the second intermediate product to within a second temperature range, which results in at least a portion of the unreactive portion of the at least one impurity being separated from the tungsten chloride to produce a product, wherein the product is enriched in tungsten chloride relative to the solid phase raw material and the second intermediate product;
wherein steps (a) through (d) are performed within a first pressure range; and
wherein the first pressure range comprises from 14.7 to 25 pounds per square inch absolute, the first temperature range comprises from 250 to 400 degrees Celsius, and the second temperature range comprises from 130 to 250 degrees Celsius;
or wherein the first pressure range comprises from 100 to 500 torr absolute, the first temperature range comprises from 200 to 300 degrees Celsius, and the second temperature range comprises from 60 to 200 degrees Celsius;
or wherein the first pressure range comprises less than 1 torr absolute, the first temperature range comprises from 130 to 250 degrees Celsius, and the second temperature range comprises from 130 to 250 degrees Celsius.

2. The method of claim 1, further comprising: (e) cooling the unreactive portion of the at least one impurity to a third temperature range, to produce a condensed light impurity.

3. The method of claim 1, further comprising: (g) recovering the product produced in step (d) and using it as the solid phase raw material in step (a).

4. The method of claim 1, wherein step (a) comprises heating the solid phase raw material in a first vessel to a first temperature range, to produce a heated raw material wherein the solid phase raw material comprises at least 80 percent by weight of tungsten hexachloride, and wherein a balance of the solid phase raw material comprises at least one impurity selected from the group consisting of molybdenum chloride, chromium chloride, nickel chloride, copper chloride, and tungsten oxytetrachloride.

5. The method of claim 1, wherein step (a) comprises heating the solid phase raw material in a first vessel to a first temperature range, to produce a heated raw material wherein the solid phase raw material comprises at least 80 percent by weight of tungsten pentachloride, and wherein a balance of the solid phase raw material comprises at least one impurity selected from the group consisting of molybdenum chloride, chromium chloride, nickel chloride, copper chloride, and tungsten oxytetrachloride.

6. The method of claim 1, wherein step (a) comprises heating the solid phase raw material in a first vessel to a first temperature range, to produce a heated raw material wherein the first vessel comprises a sublimer and the first temperature range comprises a temperature range greater than a sublimation point of the tungsten chloride and less than the sublimation point of the at least one complexed impurity.

7. The method of claim 1, wherein step (a) comprises heating the solid phase raw material in a first vessel to a first temperature range, to produce a heated raw material wherein the first vessel is a smelter and the first temperature range comprises a temperature range greater than the melting point of the solid phase raw material.

8. The method of claim 1, wherein step (b) is performed in an absorption column.

9. The method of claim 1, wherein step (b) is performed in the first vessel.

10. The method of claim 8, wherein step (c) further comprises directing the second intermediate product to a process tool.

11. The method of claim 1 wherein step (b) further comprises contacting the heated raw material with a getter selected from the group consisting of potassium chloride and sodium chloride.

12. The method of claim 1, wherein step (d) further comprises wherein the second temperature range comprises a temperature range sufficient to cause the deposition of the second intermediate product to produce the product and to maintain the unreactive portion of the at least one impurity in a gaseous phase.

13. The method of claim 1, wherein step (d) further comprises separating the second intermediate product from the unreactive portion of the at least one impurity by cooling the second intermediate product to a second temperature range to produce a product, wherein the product comprises less than 10 parts per million by weight of the at least one impurity.

14. The method of claim 1, wherein step (d) further comprises separating the second intermediate product from the unreactive portion of the at least one impurity by cooling the second intermediate product to a second temperature range to produce a product, wherein the product comprises less than 5 parts per million by weight of the at least one impurity.

15. The method of claim 1, wherein step (b) further comprises: wherein the getter comprises a concentration, the concentration comprising at least 0.1 percent by weight of the solid phase raw material.

* * * * *